United States Patent [19]
Schiele et al.

[11] Patent Number: 6,162,657
[45] Date of Patent: Dec. 19, 2000

[54] METHOD FOR MANUFACTURING A MICROMECHANICAL RELAY

[75] Inventors: Ignaz Schiele, München; Frank Kozlowski, Grafrath, both of Germany

[73] Assignee: Fraunhofer-Gesellschaft zur Förderung der angewandten Forschung e.V., Munich, Germany

[21] Appl. No.: 09/308,007

[22] PCT Filed: Nov. 6, 1997

[86] PCT No.: PCT/EP97/06174

§ 371 Date: May 11, 1999

§ 102(e) Date: May 11, 1999

[87] PCT Pub. No.: WO98/21734

PCT Pub. Date: May 22, 1998

[30] Foreign Application Priority Data

Nov. 12, 1996 [DE] Germany .......................... 196 46 667
Jul. 12, 1997 [DE] Germany .......................... 197 30 715

[51] Int. Cl.$^7$ .................................................. H01L 21/00
[52] U.S. Cl. ............................... 438/52; 438/48; 438/50
[58] Field of Search .................. 438/48, 50, 51, 438/52, 54, 55

[56] References Cited

U.S. PATENT DOCUMENTS

| | | |
|---|---|---|
| 4,959,515 | 9/1990 | Zavracky . |
| 5,510,156 | 4/1996 | Yang . |
| 5,814,554 | 9/1998 | De Samber et al. ...................... 438/50 |
| 5,847,631 | 12/1998 | Taylor et al. .............................. 438/52 |

FOREIGN PATENT DOCUMENTS

| | | |
|---|---|---|
| 07 51 546 | 1/1996 | European Pat. Off. . |
| 07 11 029 | 5/1996 | European Pat. Off. . |
| 26 23 577 | 3/1980 | Germany . |
| 42 05 029 | 2/1993 | Germany . |
| 43 02 204 | 9/1993 | Germany . |
| 44 37 260 | 10/1995 | Germany . |
| 44 37 261 | 10/1995 | Germany . |

| | | |
|---|---|---|
| WO 91 052 84 | 4/1991 | WIPO . |

OTHER PUBLICATIONS

IBM Technical Disclosure Bulletin, vol. 30, No. 6, Nov. 19 7, 393.

Storment et al. "Flexible, Dry–Released Process for Aluminum Electrostatic Actuators", Journal of Microelectricalmechanical Systems, No. 3, Sep. 1994.

Legtenberg et al. "Electrostatic Curved Electrode Actuators", Journal of Microelectromechanical Systems, vol. 6, No. 3, Sep., 1997.

Gretillat et al. "Electrostatic Polysilicon Microrelays Integrated with MOSFETs", Institute of Microtechnology IEEE MEMES Workshop 94, Oiso, Japan.

(List continued on next page.)

*Primary Examiner*—Kevin M. Picardat
*Attorney, Agent, or Firm*—Dougherty & Associates

[57] ABSTRACT

A method of producing a micromechanical relay comprises the steps of providing a substrate including a conductive fixed electrode in or on said substrate. A sacrificial layer and a conductive layer are applied and the conductive layer is structured so as to define a beam structure as a movable counterelectrode opposite said fixed electrode. A contact area is applied, the conductive layer extending between an anchoring region and the contact area and being insulated from said contact area. Subsequently, the sacrificial layer is removed by means of etching so as to produce the beam structure comprising a movable area and an area secured to the anchoring region on the substrate. The beam structure is defined such that etch access openings in said beam structure are structured such that the size of the area covered by the etch access openings used for etching the sacrificial layer increases from the area of the beam structure secured to the substrate to the movable area of the beam structure so that the etching of the sacrificial layer is controlled in such a way that the portion of the sacrificial layer arranged below the movable area of the beam structure is etched faster than the portion of the sacrificial layer arranged in the area of the anchoring region.

28 Claims, 8 Drawing Sheets

OTHER PUBLICATIONS

Zavracky et al. "Micromechanical Switches Fabricated Using Nickel Surface Micromatching", Journal of Microelectromechanical Systems, vol. 6, No. 1, Mar. 1997.

Schiele et al., "Micromechanical Relay with Electrostatic Actuation", Proceedings transducers 97, 9th International Conference on Solid–State Sensors and Actuators, Chicago, Illinois, 16–19 Jun., 1997.

K.E. Petersen, "Micromechanical Membrane Switches on Silicon", IBM, J. Res. DeV., vol. 23, No. 4, Jul. 1979, pp. 367–384.

K.E. Petersen, "Dynamic Micromechanics on Silicon, Techniques and Devices", IEEE Transaction on Electron Devices, vol. ED–25, No. 10, Oct. 1978, pp. 1241–1249.

Legtenbert et al., "Electrostatic Curved Electrode Actuators", IEEE 1995, (0–7803–2503–6), pp. 37–43.

METHOD FOR MANUFACTURING A MICROMECHANICAL RELAY

BACKGROUND OF THE INVENTION

1. Field of the Invention

The present invention refers to a method of producing a micromechanical relay.

2. Description of Prior Art

A relay fundamentally serves to switch electric currents. Since the switching of electric currents often has to be accomplished in the field of technology, there is a large field of application for relays. Recently, micromechanical relays have been developed, which, due to the use of semiconductor technology, are based on a new electrostatic principle of action.

This electrostatic principle of action permits an almost powerless switching of currents. This property is of importance especially in cases of use where a connection to the electric mains is not possible, i.e. in cases of use where power is supplied by a battery. Such use becomes increasingly common, e.g. in wireless transmission in the field of communication technology. In order to guarantee here a sufficiently long operating time, it is important to keep power consumption low. A micromechanical relay can expediently be used in this respect.

A second exemplary field of use for a micromechanical relay is the switching of high-frequency signals. Such a high-frequency relay must have a low characteristic impedance so that it can be used e.g. in the field of high-frequency measurement technology. A micromechanical relay has this property so that such a component offers excellent advantages especially as far as high-frequency technology is concerned. DE 4205029 C1 and DE 4437261 C1, for example, disclose electrostatically actuated micromechanical relays. The electrostatic forces are in each case produced according to the same principle. A voltage is applied between two capacitor plates. A micromechanical structure used as a movable counterelectrode changes its position relative to a fixed electrode due to the electrostatic force. When a voltage is applied to the electrodes, the movable counterelectrode is therefore attracted by the fixed electrode.

For producing the micromechanical relay, a freestanding movable structure carrying the contact pieces must be produced. This is done by means of a back etching process in the case of the known embodiments. In such a back etching process, the wafer is etched through from the back in a KOH etching bath until a freestanding structure is obtained. Due to the specific etching angles used in this process, the space required for a structure is much larger than the structure itself. It follows that, in the case of the known manufacturing method for micromechanical relays, the area required per component during the production process is much larger than the area which is actually occupied by the finished component.

It is true that, when a movable structure has been etched free by means of a back etching process according to the known method, a freestanding structure is obtained, but a substrate material which could be used as an electrode no longer exists below said freestanding structure, i.e. the movable beam. Hence, at least a second chip provided with a fixed electrode must be arranged above the processed chip to which a voltage can then be applied. The connection of the two chips, the so-called chip bonding is, however, very expensive and difficult.

In the case of all known micromechanical relays, the freestanding beam carries the contact structures, one possibility being to arrange this contact structure such that it extends in the longitudinal direction of the beam. This has, however, the disadvantage that this metal structure must be very thin so as to reduce the thermostatic bimetal effect between the supporting beam and the conductor path. It is therefore common practice to produce micromechanical relays with a dual contact in the case of which a contact bridge extends transversely across the movable beam top. On the basis of this arrangement, the beam is prevented from curving due to the thermostatic bimetal effect.

U.S. Pat. No. 4,959,515 discloses a method of producing a micromechanical switch provided with a lever arm which is fixed at one end and the free end of which can be used for closing a contact by means of electrostatic attraction. The lever arm fixed at one end is produced by fully etching a nickel layer, which is used as a sacrificial layer, by means of a strong solution.

EP-A-0711029 describes the production of a microstructure with a movable arm by etching off an adhesive-agent sacrificial layer below said movable arm.

SUMMARY OF THE INVENTION

It is an object of the present invention to provide a simple and space-saving method of producing a micromechanical relay.

This object is achieved by a method of producing a micromechanical relay, which comprises the step of providing a substrate including a conductive fixed electrode in or on said substrate. A sacrificial layer and a conductive layer are applied and the conductive layer is structured so as to define a beam structure as a movable counterelectrode opposite said fixed electrode. A contact area is applied, the conductive layer extending between an anchoring region and the contact area and being insulated from said contact area. Subsequently, the sacrificial layer is removed by means of etching so as to produce the beam structure comprising a movable area and an area secured to the anchoring region on the substrate. The beam structure is defined such that etch access openings in said beam structure are structured such that the size of the area covered by the etch access openings used for etching the sacrificial layer increases from the area of the beam structure secured to the substrate to the movable area of the beam structure so that the etching of the sacrificial layer is controlled in such a way that the portion of the sacrificial layer arranged below the movable area of the beam structure is etched faster than the portion of the sacrificial layer arranged in the area of the anchoring region.

In a first preferred embodiment of the method according to the present invention, two contacts are formed in or on the substrate, the contact area formed extending at least between said contacts and over them, said contact area being spaced from said contacts by the sacrificial layer.

According to one embodiment, the sacrificial layer is structured after its application so as to define the anchoring region of the beam structure relative to the substrate.

According to a second preferred embodiment of the method according to the present invention, the sacrificial layer is etched in such a way that a part of said sacrificial layer remains so as to form an anchoring layer for the fixed part of the beam structure for anchoring to the substrate. In this embodiment, two contacts arranged on the sacrificial layer can additionally be formed by structuring the conductive structure, the sacrificial layer being then etched in such a way that also two support areas of the sacrificial layer remain on the substrate, the contacts being arranged on said support areas.

According to known manufacturing methods for microrelays, a bulk micromechanical process, which necessitates a back etching step, is used in most cases. In the relay according to the present invention this is not the case, since said relay is produced by means of surface-micromechanical techniques. Due to the use of surface micromechanics, the method according to the present invention is independent of the substrate material. Furthermore, the component size and the chip area required for production can be kept small in this way.

A dry etching process is preferably used for removing the sacrificial layer. This is possible in view of the fact that an organic sacrificial layer material is used as a sacrificial layer, which can also be referred to as spacing layer. Such an organic sacrificial layer material is e.g. polyimide. Due to the use of dry etching, the problem that, after the etching, the movable beam structure may stick to the substrate or to a layer applied to the substrate is avoided. The structures etched free are not drawn onto the substrate but remain free standing.

For the function of an electrostatically actuated micromechanical relay, it is absolutely necessary that the electrode and the counterelectrode are located very close to one another. In the case of hitherto known methods of producing a micromechanical relay, this is achieved by the bonding of two chips. According to the present invention, such bonding is not necessary, since the substrate material is not removed during the production steps. Hence, the relay is fully produced on the wafer, only the surface of the wafer being processed.

In order to guarantee a precise function of the micromechanical relay, it will be advantageous to subject the subsequently freestanding beam structure to a predeflection. This predeflection of the beam structure must be precisely controllable for guaranteeing a high-precision function of the micromechanical relay. The present invention provides a layer structure of the beam structure which permits, e.g. by selecting a suitable strip width, a precise adjustment of the degree of predeflection. It is therefore not necessary to change process parameters or layer thicknesses for obtaining a different stress state in the beam structure. According to the present invention, this can be achieved for beams fixed at one end as well as for beams fixed at both ends.

In order to increase the contact surface between the contact area extending transversely to the movable beam structure and the two contacts to be switched by means of the relay, a layer with a compressive stress is applied to the contact area extending transversely to the beam structure according to one embodiment of the present invention. This has the effect that the contact area is deflected downwards. When a voltage has been applied between the fixed electrode and the movable counterelectrode, the beam will be drawn downwards by the electrostatic forces to such an extent that the contact area, which is also referred to as contact bridge in the present connection, rests on the contacts on the substrate in almost plane contact therewith. A large contact surface is produced in this way. In addition, opening of the relay is additionally accelerated by the energy stored in the contact bridge.

According to the present invention, beams fixed at one end and beams fixed at both ends can be used as a counterelectrode. In order to achieve a predeflection for both variants, two different stress states are, in principle, necessary. By means of a suitable layer structure and by selecting suitable etching angles when the conductive layer is being structured for defining the beam structure, it is, however, possible to achieve a predeflection for both variants on the basis of the same process steps. The beam structure is peferably implemented as a plurality of juxtaposed individual beams so as to prevent the beam structure from curving transversely. These individual beams are preferably etched through completely, the whole beam structure consisting of juxtaposed long strips. This structural design of the beam structure helps to guarantee a predeflection for a beam structure fixed at one end as well as for a beam structure fixed at both ends. By suitably selecting the method steps of the present invention, it is possible to control the predeflection of the beam structure by a geometrical change of the individual beams, e.g. a change of the width of the long strips, whereas the process parameters can be kept constant.

As far as the above-described sticking is concerned, it can be differentiated between two variants. One the one hand, sticking can occur during the production of an electrostatically actuated micromechanical relay and, on the other hand, it can occur during operation of said relay. As has been described hereinbefore, a so-called sacrificial layer is used, which is removed by means of etching so as to produce the beam structure including a movable area. When the sacrificial layer is removed in a wet-chemical process, sticking occurs frequently, since, due to the adhesive forces of the drying liquid, the structure is drawn towards the substrate to which it will then stick. The present invention, however, uses a sacrificial layer which can be removed by a dry etching process so that this problem is avoided and will not arise, consequently.

In a microrelay of the kind described, a movable beam structure is drawn to a substrate by electrostatic forces, said beam structure resting then on the substrate in full-area contact therewith. If the voltage supply is interrupted, the beam will return to its starting position due to the elastic restoring forces acting thereon. It is, however, possible that, when the relay is in operation, the structures are deflected towards the substrate to such an extent that the adhesive forces between the surfaces of the solids, e.g. the Coulomb force and the Van der Waals force, become so strong that they exceed the elastic restoring forces acting due to the vertical deflection of the beam. This may have the effect that the structures stick permanently to the substrate. It is also possible that the restoring forces of the beam deteriorate due to material fatigue during the service life so that permanent sticking of the structure to the substrate may occur as a result: of such reduced restoring forces.

A further advantage of the present invention is to be seen in the fact that in a micromechanical relay produced by means of the method according to the present invention the movable electrode can be prevented from sticking to the fixed electrode during operation of the relay in that, in the step of providing a substrate with a conductive fixed electrode in or on said substrate, the conductive fixed electrode is provided with surface properties of such a nature that, during the future operation of the micromechanical relay, a contact surface of the fixed electrode with the movable counterelectrode will be reduced in comparison with the contact surface of an essentially flat surface of the fixed electrode.

For this purpose, the conductive fixed electrode can be produced e.g. by electrodeposition and can then be preetched so as to roughen the surface thereof. The conductive fixed electrode can also be produced by electrodepositing a layer, said layer being then structured so as to form elevations and depressions therein. A further possibility is the use of a monocrystalline silicon as a substrate, pyramidal structures being etched in a wet-chemical process into the surface area of said monocrystalline silicon in or on which the fixed electrode is to be formed.

Further developments of the present invention are defined in the dependent claims.

BRIEF DESCRIPTION OF THE DRAWINGS

In the following, preferred embodiments of the present invention will be explained in detail making reference to the drawings enclosed, in which:

FIG. 9a shows a sectional view of the layer structure and of the etching angle of an individual beam of the beam structure according to an embodiment of the present invention;

FIG. 9b shows the stress states in the layer structure shown in FIG. 9a;

DESCRIPTION OF PREFERRED EMBODIMENTS OF THE INVENTION

In the following, a first preferred embodiment of the production method according the present invention will be explained in detail on the basis of FIGS. 1 and 2.

Figure 1:
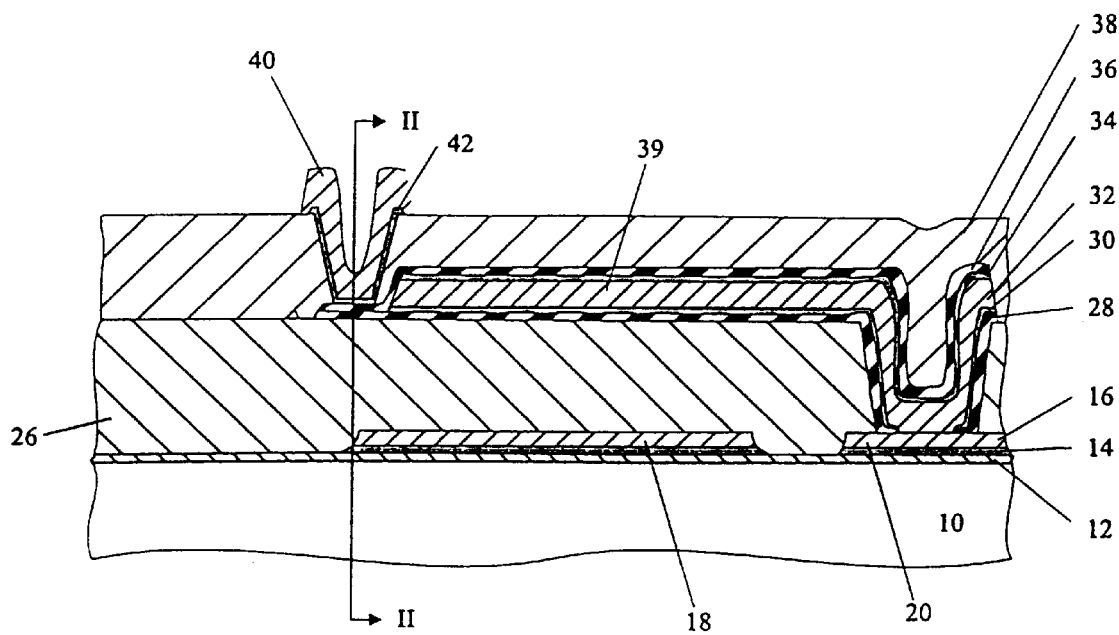
FIG. 1 shows a sectional side view of a layer structure according to a preferred embodiment of the production method according to the present invention.

In FIG. 1 all layers are shown, which are required for producing a micromechanical relay according to the preferred embodiment of the present invention. To those skilled in the art it will, however, be obvious that the method according the present invention need not comprise all the method steps described in the following according to FIG. 1; it is also possible to use alternative materials.

A substrate 10, which is a silicon wafer in the preferred embodiment, is first provided as a base material. Said substrate 10 has then applied thereto an insulating layer 12 consisting of $SiO_2$ in the case of the preferred embodiment. Subsequently, an adhesive layer 14 is deposited on said insulating layer 12, whereupon a conductive layer 16 is deposited on said adhesive layer 14. The adhesive layer 14 serves to improve the adhesion between the insulating layer 12 and the conductive layer 16. The adhesive layer 14 of the preferred embodiment consists of NiCr. Alternatively, the adhesive layer could also consist of TiW. The conductive layer of the preferred embodiment consists of gold (Au). Alternatively, the conductive layer 16 could consist of an arbitrary metal, preferably a noble metal. The gold layer 16 and the NiCr layer 14 of the preferred embodiment are subsequently structured by means of a photolithographic process so as to define a fixed electrode 18, an anchoring contact region 20 as well as a first contact 22 and a second contact 24 (cf. FIG. 2).

Instead of the above-described method for producing the fixed electrode, the anchoring contact region and the first and the second contact, it would also be possible to produce these areas by a suitable doping in the substrate 10.

Subsequently, a sacrificial layer or spacing layer 26 is applied to the now existing structure, said sacrificial layer or spacing layer 26 consisting of polyimide in the preferred embodiment. In the first preferred embodiment this sacrificial layer 26 is structured, e.g. photolithographically, so as to define an anchoring region, which is defined by the anchoring contact region 20 in the preferred embodiment.

A further preferred embodiment of the method according to the present invention, in the case of which part of the sacrificial layer is used as an anchoring layer, will be explained hereinbelow making reference to FIGS. 10a and 10b.

In the case of the first preferred embodiment, a composite layer structure consisting of a first passivation layer 28, a first adhesive layer 30, a conductive layer 32, a second adhesive layer 34 and a second passivation layer 36 is then applied. In the preferred embodiment, the materials of these layers 28 to 36 are chosen such that an $SiO_2$—NiCr—Au—NiCr—$SiO_2$ composite layer structure is obtained. This composite layer structure constitutes the basis for the future movable counterelectrode.

The composite layer structure consisting of the layers 28, 30, 32, 34, 36 is structured so as to define a beam structure which is intended to serve as movable counterelectrode 39 opposite the fixed electrode 18 later on. The formation of this beam structure will be explained in detail hereinbelow. In the present embodiment, the electrode structure is fixedly connected to the substrate 10 via the anchoring contact region 20. Alternatively, the electrode structure of this embodiment could also be fixedly connected to the substrate 10 without the anchoring contact region 20. At the other end, the electrode structure is spaced from the substrate by the sacrificial layer 26.

Subsequently, a photoresist 38 is applied to the structure obtained. The photoresist 38 is structured so as to form a mask for applying a contact bridge 40. In the preferred embodiments of the present invention, the contact bridge 40 consists of gold and, insulated through the passivation layers 28 and 36, it is attached to the subsequently movable end of the beam structure. In addition, another adhesive layer 42, which consists of NiCr, is arranged below the contact bridge 40 in the preferred embodiment.

It is apparent that the formation and the structuring of the conductive layer and of the contact area can take place in a manner deviating from the manner described hereinbefore.

Subsequently, the sacrificial layer 26, which consists of polyimide in the preferred embodiment, can be removed in a dry etching process. In such a dry etching process, it will be expedient when the tip of the beam of the beam structure, which is a cantilevered structure in FIG. 1, is etched free first and when the etching front then progressively advances towards the fixed end of the beam so as to guarantee that the beam structure is reliably etched free. When etching is carried out in this way, the beam will increasingly bend upwards so that it will be prevented from sticking to the substrate.

Alternatively, the polyimide layer is etched off from the middle of the structure to the respective anchoring subregions in a production process for a beam structure which is fixed at both ends. As will be described in more detail in the following, the etching front is controlled in that the etch attack region is enlarged in the movable area of the beam structure.

Figure 2:
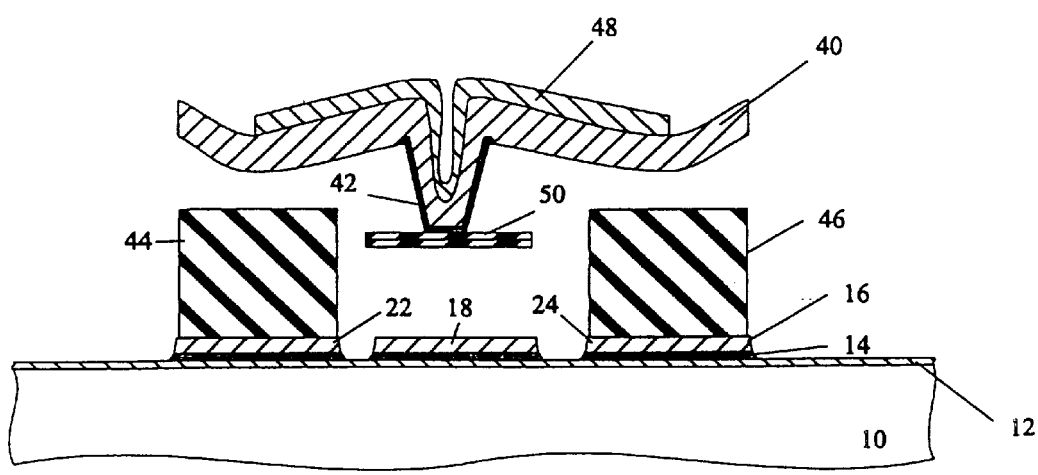
FIG. 2 shows a sectional front view along line II—II of FIG. 1.

FIG. 2 shows a sectional view along line II—II of FIG. 1. As can be seen in FIG. 2, the first and the second contact 22 and 24 of the preferred embodiment are provided with contact bumps 44 and 46 so as to facilitate contacting with the contact bridge 40 when the relay is being closed.

Since the gold layer of the contact bridge 40 is subjected to a tensile stress, this would result: in an upward deformation. In order to avoid such a deflection, a TiW layer 48 is applied to the gold layer in the preferred embodiment. The TiW layer is subject to a compressive stress. If this compressive stress exceeds the resultant tensile stress of the gold layer, the contact bridge will be deformed downwards. For obtaining an optimum contact surface between the contact bridge 40 and the contact bumps 44 and 46, it is necessary that the contact bridge 40 is again deformed upwards at a specific point, viz. in the middle of the contact bumps 44 and 46. When the relay is being closed, the contact bridge 40 will then attach itself to the contact bumps 44 and 46 and rest thereon in almost plane contact therewith so that a large contact surface will be obtained. This is achieved in that the TiW layer 48 on the contact bridge 40 is removed at these points so that, due to the tensile stress prevailing in the gold layer, the contact bridge is again deflected upwards. On the bottom side of the contact bridge 40 an insulating layer 50 is provided so as to prevent possible contacting between the contact bridge 40 and the fixed electrode 18.

When an electric field is established between the two electrodes, i.e. the fixed electrode 18 and the movable electrode 39, by applying a voltage between said electrodes, an electrostatic force will be generated, which attracts the beam towards the substrate so that the contact bridge 40 will establish a conductive connection between the contact bumps 44 and 46. When the voltage is interrupted, there is no longer any electrostatic force and the counterelectrode 39 returns to its starting position due to the restoring force of the beam. Hence, the conductive connection between the contact bumps 44 and 46, which had been established by the contact bridge 40, is eliminated. The above-mentioned restoring force of a beam fixed at both ends exceeds that of a cantilevered beam.

Figure 3:
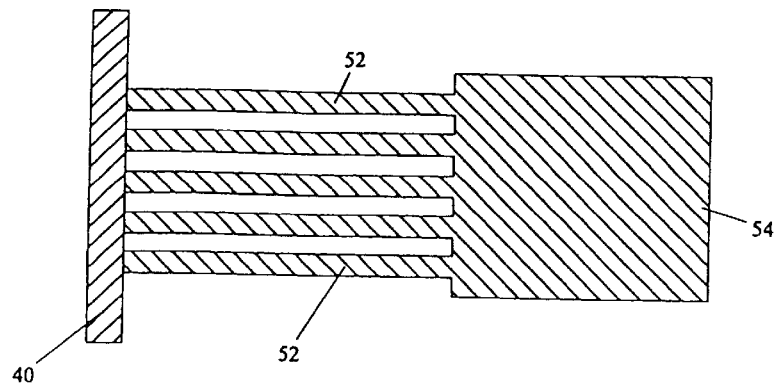
FIG. 3 shows schematically a top view of a cantilevered beam structure with anchoring region and contact bridge.

FIG. 3 shows a schematic top view of a beam structure with anchoring region and contact bridge. The beam structure is structured as a plurality of individual beams 52. On the movable ends of the individual beams 52, the contact bridge 40 is arranged in an insulated manner such that it extends transversely to the length of the individual beams 52. The individual beams 52 are secured to the substrate in an anchoring region 54. Hence, a beam structure is obtained, which is fixed at one end thereof in the anchoring region 54 and at the movable end of which the contact bridge 40 is provided. In the present embodiment, the beam structure is implemented as juxtaposed individual beams 52 so as to avoid a transverse curvature of the freestanding structures.

Figure 4:
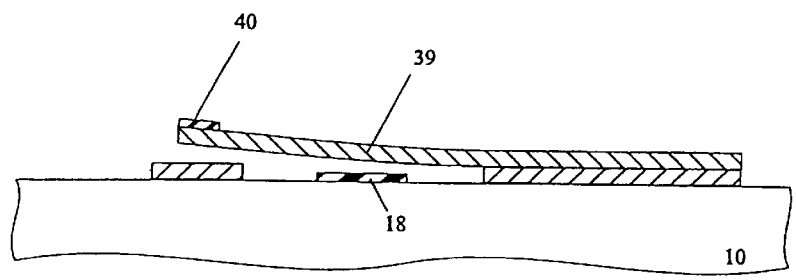
FIG. 4 shows schematically a sectional side view of a micromechanical relay produced by means of the method according to the present invention and provided with a cantilevered beam structure.

FIG. 4 shows a schematic sectional side view of a cantilevered micromechanical relay. When a voltage is applied between the electrodes 18 and 39, the movable, pretensioned end of the beam structure is drawn towards the substrate 10, whereupon the contact bridge 40 conductively interconnects contact bumps arranged on said substrate.

Figure 5:
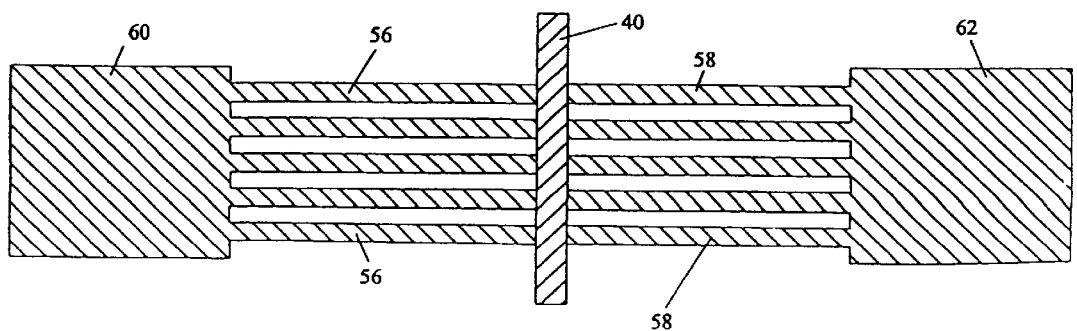
FIG. 5 shows schematically a top view of a beam structure fixed at both ends, with contact bridges and two anchoring subregions.

FIG. 5 shows a schematic top view of a beam structure fixed at both ends thereof. The beam structure consists again of individual beams 56 and 58, the respective beams being secured to a substrate in anchoring subregions 60 and 62, respectively. The beam structure fixed at both ends thereof has the contact bridge 40 arranged in the middle of the beams.

For producing a microrelay by means of surface micromechanics in accordance with the present invention, highly-integrated circuit technologies are used. This means that only planar technologies are used. Hence, a base material, a wafer, has deposited thereon layers over the full area thereof, said layers being then structured. The layer structure required is obtained by repeating this process several times.

In order to permit the application of a voltage between two layers which are separated by a spacing layer, these layers must have a certain electrical conductivity. Hence, metals are used for these layers. In order to avoid a short circuit when these layers come into contact, at least one of these metal layers must be insulated. In the preferred embodiment described hereinbefore, this insulation is provided by the two passivation layers 28 and 36 which are deposited on the bottom side and on the upper side of the movable electrode. The movable electrode is therefore insulated completely. Alternatively, an insulating layer could also be deposited on the fixed electrode 18. For improving the sticking of such a passivation layer to a metal layer, it will be advantageous to apply an intermediate layer consisting of NiCr in the preferred embodiment. As has already been mentioned, e.g. TiW could, alternatively, be used as a material for the adhesive layer.

The material used for the contact-establishing structures, i.e. the contact bumps 44 and 46 and the contact bridge 40, is preferably a noble metal, since such a material can satisfy the requirements with regard to contact resistance, burn-up and the welding behaviour.

The method of producing a micromechanical relay according to the present invention necessitates that the sacrificial or spacing layer 26 between the two electrodes 18 and 39 is removed. In order to prevent the movable electrode 39, i.e. the beam structure, from sticking to the substrate, this layer is preferably removed in a dry etching process. In such a dry etching process, inhomogeneities may occur, i.e. the sacrificial layer may be removed faster at some points and less fast at others. This increases, in turn, the risk of sticking of the beam structure to the substrate, since, due to irregular etching free, the beam can already curve at the beginning to such an extent that sticking will occur when the sacrificial layer has been removed.

The above-described sticking can be avoided by an embodiment of the method according to the present invention by guaranteeing that the beam tip is etched free at the beginning and that the sacrificial layer is then removed progressively towards the beam end secured to the substrate. For controlling the etching process to a defined extent, the etch access holes, which permit etching of the sacrificial layer, must be arranged in a specific manner.

Figure 6:
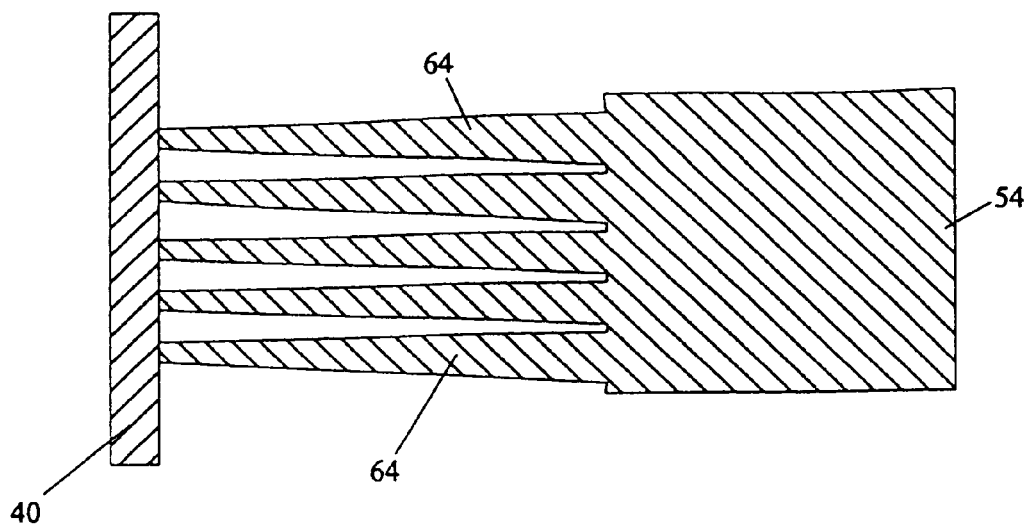
FIG. 6 to 8 show schematic top views of cantilevered beam structures having different structural designs, each with contact bridge and anchoring region.

FIG. 6 shows a schematic top view of a beam structure fixed at one end thereof, with anchoring region 54 and contact bridge 40. The beam structure comprises again a plurality of individual beams 64. In the embodiment shown in FIG. 6, the individual beams are, however, wedge-shaped. In the area of the anchoring region 54, the individual beams 64 are broader, whereas they become increasingly narrower towards the movable end of the beam structure at which the contact bridge 40 is attached. The etch access openings, which are defined by the spaces between the individual beams 64, are therefore large at the free end of the beam structure and decrease in size towards the anchoring region, whereby the etching front can be controlled in such a way that the sacrificial layer is removed faster in the area of the movable end of the beam structure.

Figure 7:
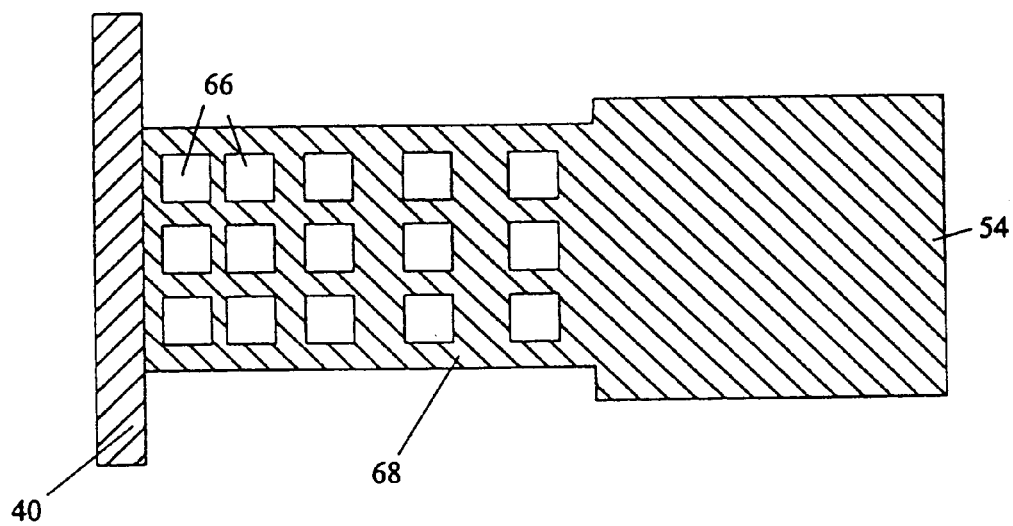

FIG. 7 shows a beam structure in the case of which a plurality of etch access openings 66 is arranged in a beam structure formed by a single beam 68. The etch access openings 66 are arranged closer to one another in the movable area of the beam structure so as to enlarge the etch access opening area in this region in comparison with the regions in the vicinity of the anchoring region 54. Also this has the effect that the etching accomplished in the area of the movable end is faster than that accomplished in the vicinity of the anchoring region 54, whereby sticking is prevented.

Figure 8:
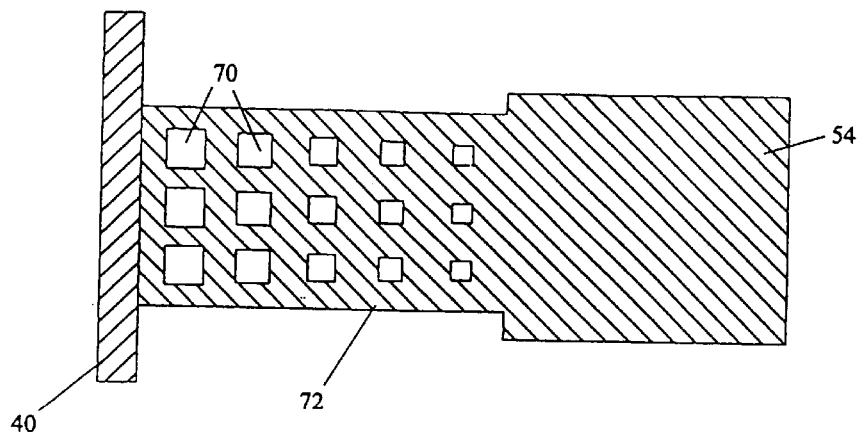

FIG. 8 shows a similar embodiment, where a plurality of etch access openings 70 is again arranged in a beam structure formed of a single beam 72. The size of the etch access openings 70 decreases from the movable end of the beam structure towards the anchoring region 54. Controlled etching is again possible in this way.

The above-described different geometries of the beam structure all serve to guarantee that the movable electrodes are reliably etched free and that the risk of sticking is minimized. The etching front is, of course, also controlled due to the fact that, in the case of the geometries shown, the surface to be undercut is smaller in the area of the movable beam end than in the area located towards the beam end secured to the substrate. This means that the sacrificial layer can be removed faster in the area of the movable end of the beam structure so that defined etching free is made possible.

The dry etching process used in accordance with the preferred embodiment of the present invention is advantageous in comparison with a wet etching process as far as sticking is concerned. In wet-chemical etching processes, the movable structure is in most cases drawn towards the substrate, to which it will then stick, due to the adhesive forces of the drying liquid. Hence, it will be advantageous to choose a material which can be removed in a dry etching process as a sacrificial layer material. An organic material, which is polyimide in the case of the preferred embodiment of the present invention, can be used advantageously for this purpose. Since the temperature resistance of this kind of layer is normally rather poor, the subsequent process steps must be adapted to these demands; the method of producing a micromechanical relay according to the present invention provides this adaptation.

For producing a micromechanical relay, it is necessary to apply different layers one on top of the other. These layers are normally subject to stresses. This means that an impressed compressive stress or tensile stress exists in each layer. Which kind of stress exists in the respective layer depends on the layer material and on the process parameters. In the case of the method of producing a micromechanical relay according to the present invention, this property can be utilized by producing in the freely movable structure a stress condition to a defined extent. This can cause a predeflection of the beam so that, when the beam has been closed, a still larger amount of energy can be stored in said beam. This additional energy can advantageously be used for accomplishing the opening of the contacts, i.e. the removal of the contact bridge 40 from the contact bumps 44 and 46, within a very short period of time. Such rapid opening and closing of the contacts is advantageous for operating a microrelay.

Figure 9:
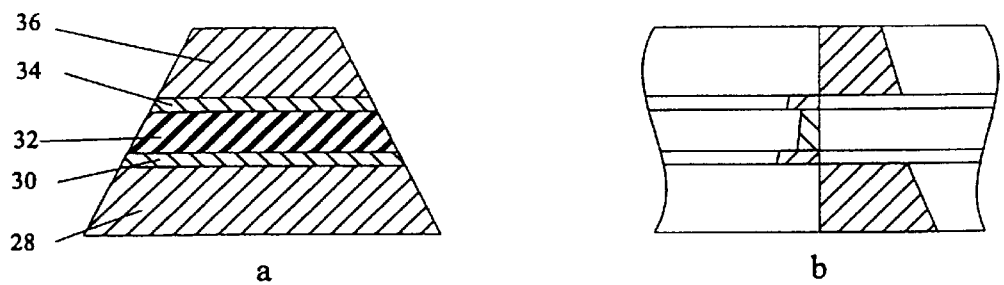

In the case of the preferred embodiment, the passivation layers 28 and 36 are used for defining an impressed defined self-contained stress of the beam structure. FIG. 9a shows a section through an individual beam of a beam structure consisting of a plurality of individual beams. The layer structure comprising the two passivation Layers 28 and 36, the two adhesive layers 30 and 34 as well as the conductive layer 32 corresponds to the layer structure existing in the case of the preferred embodiment described hereinbefore with reference to FIG. 1.

This composite layer structure has the effect that beams fixed at both ends as well as beams fixed at one end are deformed upwards when the compressive stress of the lower $SiO_2$ layer 28 exceeds the resultant compressive stress of the other layers. The composite layer structure is preferably etched at an angle of approximately 45° so that the volume of the lower $SiO_2$ layer 28 is larger than the volume of the upper $SiO_2$ layer 36. The etching process therefore results in a volume of the lower passivation layer 28 that is larger than the volume of the upper passivation layer 36, and, consequently, the compressive stress caused by the lower passivation layer 28 exceeds the compressive stress caused by the upper passivation layer 36.

The predeflection of the beams can be varied by varying the strip width of the individual beams of a beam structure. Since, in the case of small strips, the volume ratio of the upper $SiO_2$ layer 36 to the lower $SiO_2$ layer 28 is small, the structure will be deflected more strongly. When broader strips are used, the predeflection will be less strong.

The upward deflection of the beam can be supported by an impressed tensile stress of the adhesive layers and of the metal layer.

FIG. 9b shows the stress states of the composite layer structure shown in FIG. 9a. As can be seen in said figure, the compressive stress caused by the lower passivation layer 28 exceeds the compressive stress caused by the upper passivation layer 36. A defined predeflection of the beam structure can therefore be achieved by the non-vertical etching of the individual beams and the adjustment of the width of the individual beams. Alternatively, such a predeflection can be achieved by making the lower passivation layer thicker than the upper passivation layer so that the compressive stress of the lower layer will again exceed the compressive stress of the upper layer.

As has already been described with regard to FIG. 2, the contact bridge is preferably coated with a compensation layer. The contact bridge closes and opens the current paths, and, consequently, it is necessary to keep the contact resistance between the contact bridge and the terminal pads to be contacted as low as possible. In order to achieve this, it must be guaranteed that the contact surface between the contact bridge and the terminal pads is as large as possible. Since the layer material of the contact bridge is subject to a tensile stress, the contact bridge is predeflected upwards. For compensating this deformation, the compensation layer with an inverse self-contained stress, i.e. with a compressive stress, is applied. The self-contained stress of the compensation layer must be so strong that it exceeds the tensile stress of the contact bridge, since the movable contact piece will be deformed downwards only if this is the case. As has already been described, it is necessary that the two ends of the contact bridge curve upwards again so as to obtain an optimum contact surface between the fixed terminal pads and the movable contact bridge. This is achieved in that the compensation layer is not applied to the contact bridge in full length, but only up to the point where said contact bridge should curve upwards again, i.e. advantageously up to a point located approximately in the middle of the termial pads. At this point, the compensation layer becomes ineffective and the resultant self-contained stress of the material of the contact bridge acts again on the structure so that said structure will curve upwards again at this location, as can be seen in FIG. 2.

Figure 10A:
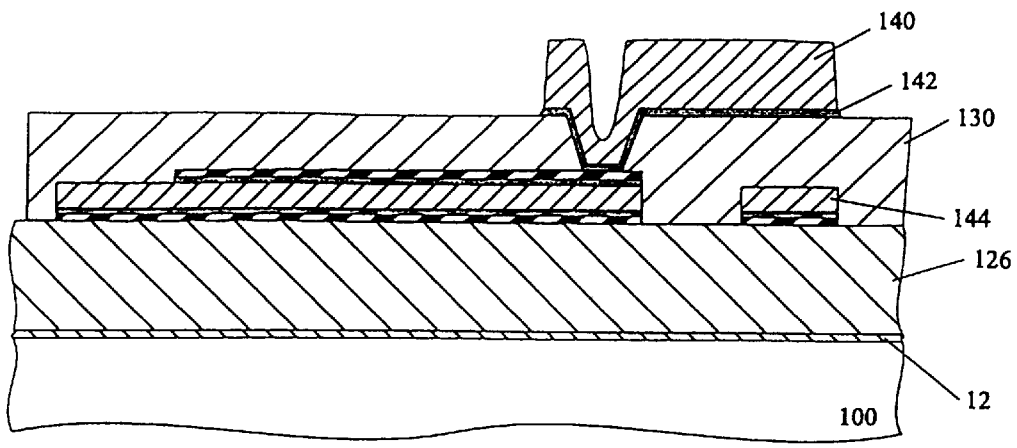
FIGS. 10a and 10b show sectional side views for illustrating a further embodiment of the method according to the present invention.
Figure 10B:
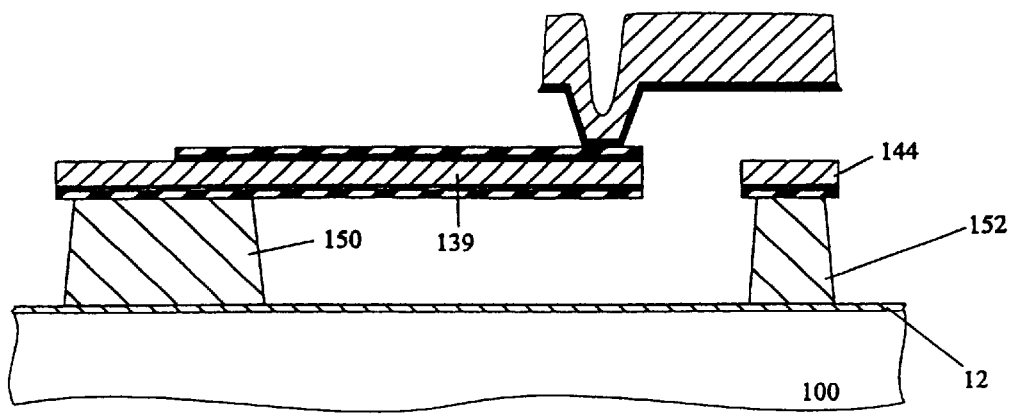

FIGS. 10a and 10b show sectional side views of the layer structure before and after the removal of the sacrificial layer; these sectional side views serve to illustrate a second preferred embodiment of the present invention. The second preferred embodiment differs from the first preferred embodiment essentially with regard to the formation of the anchoring region of the beam structure on the substrate. The above-described configurations of the beam structure and the described methods for etching the sacrificial layer can also be used for the second embodiment.

A substrate 100 is again used as a base material, said substrate 100 being once more a silicon wafer in this embodiment. In the present embodiment, the substrate 100 is doped so as to define a fixed electrode. The substrate can be doped over the full area or partially. Subsequently, the substrate 100 has applied thereto an insulating layer 12, e.g. $SiO_2$.

Following this, the resultant structure has applied thereto a sacrificial layer or spacing layer 126 consisting again of polyimide in this embodiment. This sacrificial layer 126 is, however, not photolithographically structured, but it remains as an uninterrupted flat layer.

The sacrificial layer 126 of this embodiment has now applied thereto the composite layer structure which has been described with reference to the first embodiment. The composite layer structure is then structured, e.g. photolithographically, so as to define the beam structure and, in addition, the two contacts to be closed by the relay; in FIGS. 10a and 10b only one of said contacts, viz. contact 144, is shown. During or after said structuring, the upper passivation layer and the upper adhesive layer are removed from the contacts. Following this, a contact area in the form of a contact bridge 140 is formed by means of photolithographic processes, e.g. by making use of a mask 130, said contact bridge 140 being formed on the subsequently movable end of the beam structure, such that it is insulated from said beam structure; at least part of the bottom side of the contact bridge has again arranged thereon an adhesive layer 142.

Following this, the mask 130 is removed and the sacrificial layer is etched in such a way that parts of said sacrificial layer remain as an anchoring region 150 for the movable counterelectrode 139 and as support areas 152 for the contacts, only one of said contacts, viz. contact 144, being shown in FIGS. 10a and 10b. The maintenance of the anchoring region 150 and of the support areas 152 for the contacts is accomplished by temporally limited etching, which, though it produces a freestanding beam structure, leaves in the anchoring region a sufficient amount of polyimide for using it as an anchoring layer.

It is apparent that, also in the case of this embodiment, the contacts could be formed in or on the substrate prior to the application of the sacrificial layer and could then be provided with contact bumps.

Hence, the present invention provides a method of producing a micromechanical relay which uses exclusively a surface micromechanical process so that the area required per component is much smaller. In addition, the chip bonding used in known manufacturing methods can be dispensed with according to the present invention.

Making reference to FIGS. 11–19, further embodiments of micromechanical relays, which have been produced by means of the method according to the present invention, will be explained in the following. In FIGS. 11–19, identical reference numerals have been used for elements corresponding to those of FIGS. 1–10, said elements being not explained again in the following.

As has been mentioned hereinbefore, it is the object of the present invention to reliably prevent permanent sticking of a movable electrode of a micromechanical relay to the fixed electrode when the micromechanical relay is in operation. In order to achieve this, the adhesive forces between the structure, i.e. the movable electrode, and the substrate, i.e. the fixed electrode, must be reduced. This can be accomplished by reducing the contact surface between these two structures.

Figure 11:
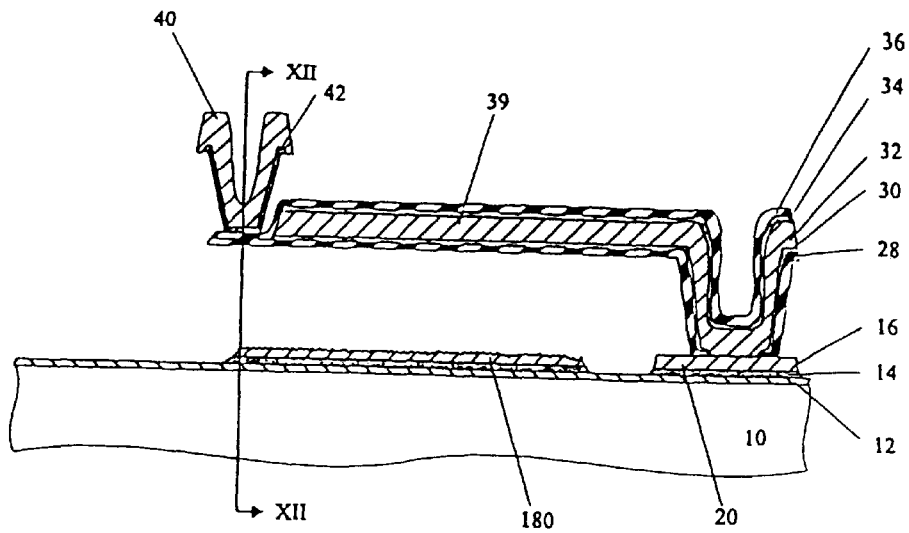
FIGS. 11 and 12 show a sectional side view and a sectional front view along line XII—XII of FIG. 11 of a micromechanical relay produced by means of a further embodiment of the method according to the present invention.
Figure 12:
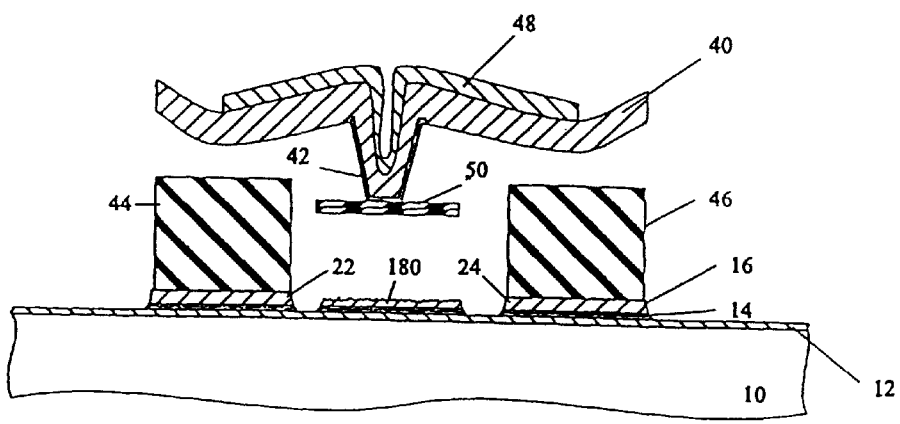
Figure 13:
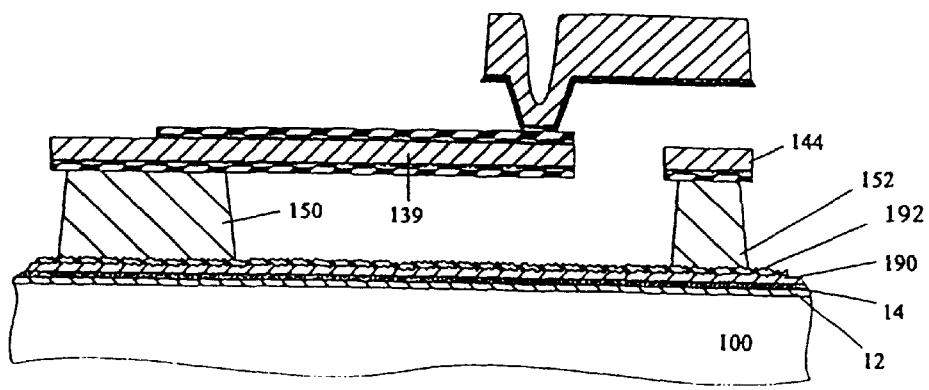
FIG. 13 shows an alternative embodiment of a micromechanical relay, the surface of the fixed electrode thereof corresponding to the surface of the micromechanical relay shown in FIGS. 11 and 12.

One possibility of achieving this is shown in FIGS. 11–13. In order to reduce the contact surface between the supported movable structure, i.e. electrode 39 in FIG. 11, for example, and the substrate, i.e. the fixed electrode 180 in FIGS. 11 and 12, an electrodeposited fixed electrode 180 is used according to this embodiment of the method according to the present invention. This electrodeposit used as a fixed electrode can either be structured as a fixed electrode 180, cf. FIGS. 11 and 12, or it can be deposited over the full area, cf. electrode 190 in FIG. 13. Preferably, a gold layer is electrodeposited. Following this, the electrodeposited layer is pre-etched so as to roughen the surface thereof.

This results, due to the topography of the surface, in a reduced area of contact, i.e. a reduced contact surface between the movable electrode and the fixed electrode. By means of this method, it is, however, only possible to reduce the contact surface to a limited extent.

Figure 14:
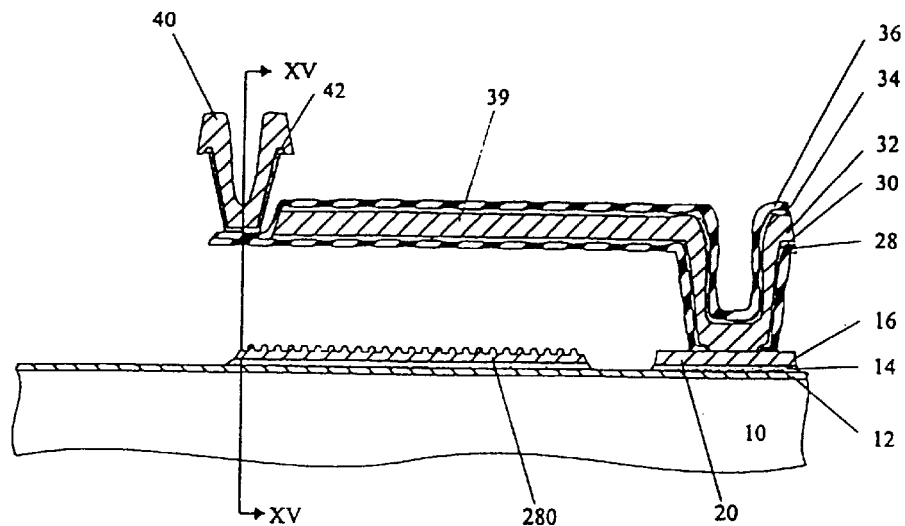
FIGS. 14 and 15 show a sectional side view and a sectional front view along line XV—XV of FIG. 14 of a micromechanical relay produced by means of a further embodiment of the method according to the present invention.
Figure 15:
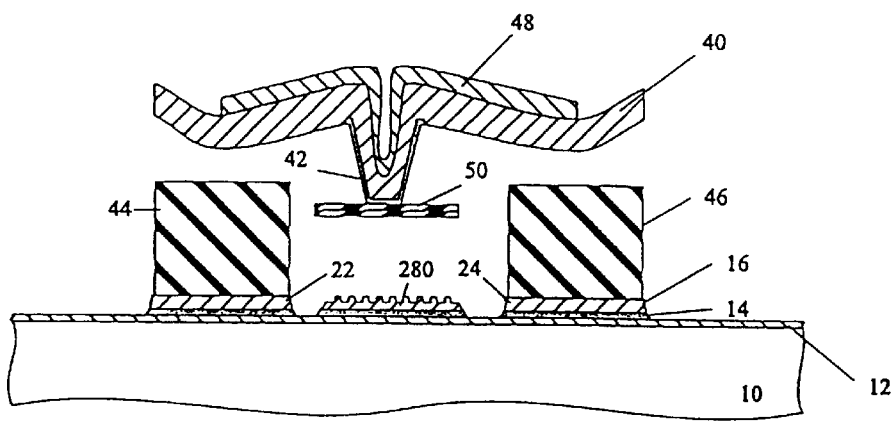

A second method resulting in a reduction of the contact surface according to the present invention is explained hereinbelow with reference to FIGS. 14–16. In the case of this embodiment, an electrodeposited layer, which is preferably used as a fixed electrode, is structured in such a way that elevations are formed. These elevations and depressions are produced by means of a wet-chemical process or by means of a dry etching process. The phototechnique used is in this case of such a nature that elevations are produced at regular intervals, the movable electrode resting on said elevations in the deflected condition. The fixed electrode can again be in full-area contact with the substrate, cf. electrode 290 in FIG. 16, or it can be structured on said substrate, cf. electrode 280 in FIGS. 14 and 15. This production of depressions and elevations permits a substantial reduction of the contact surfaces, said anti-adhesion elevations being very blunt and the dimensions of the elevations depending also on the resolution of the phototechnique.

Figure 16:
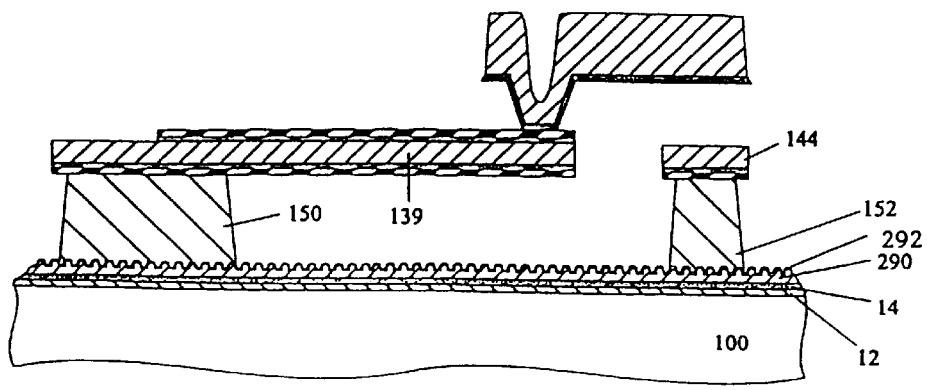
FIG. 16 shows an embodiment of a micromechanical relay whose fixed electrode has a surface corresponding to the surface of the fixed electrode of the micromechanical relay shown in FIGS. 14 and 15.

In FIGS. 13 and 16, a thin adhesive layer 192, 292 is additionally shown, which is provided between the electrodeposited gold layer 190 and 290, respectively, and the support 152 consisting e.g. of polyimide. This adhesive layer 192 and 292, respectively, serves to improve the adherence between the gold layer and the polyimide support. This adhesive layer consists e.g. of Ti. Since such an adhesive layer is very thin and since, due to the sputtering process by means of which said adhesive layer is applied, a corresponding image of the surface structure is formed, the surface roughness resulting in the reduced contact surface is maintained.

Figure 17:
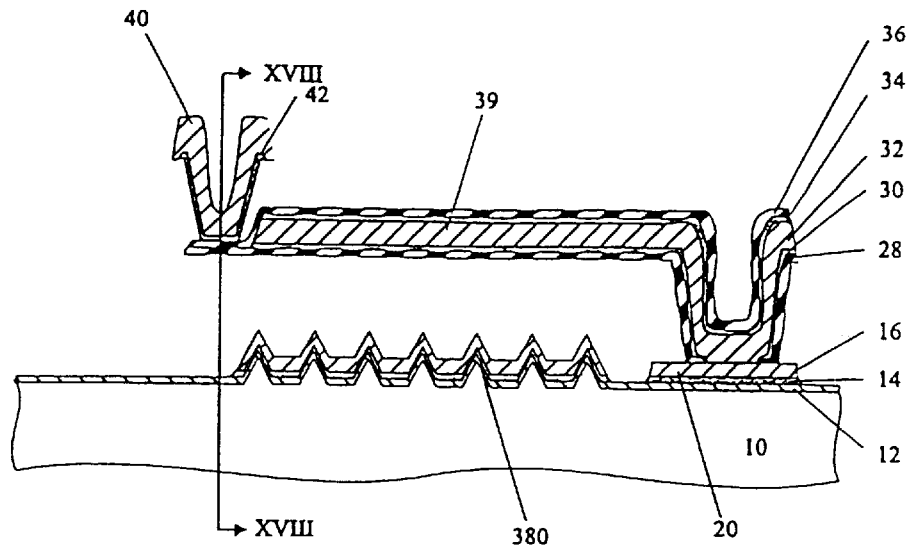
FIGS. 17 and 18 show a sectional side view and a sectional front view along line XVIII—XVIII of FIG. 17 of a micromechanical relay produced by means of the method according to the present invention.
Figure 18:
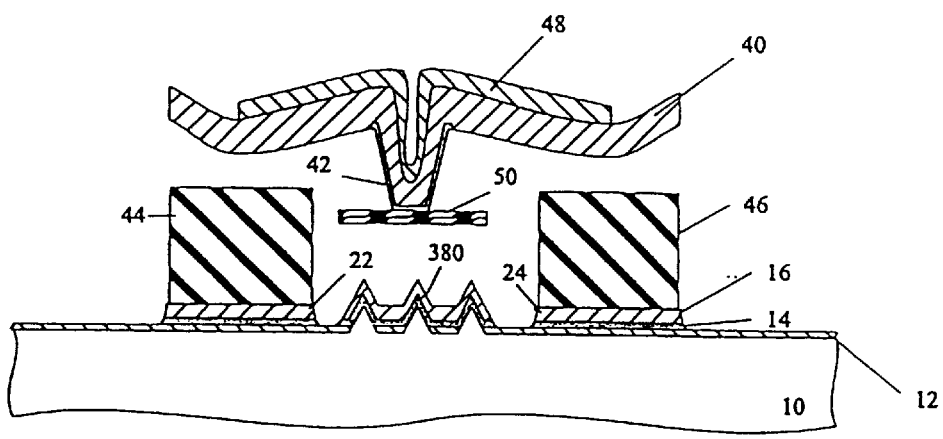
Figure 19:
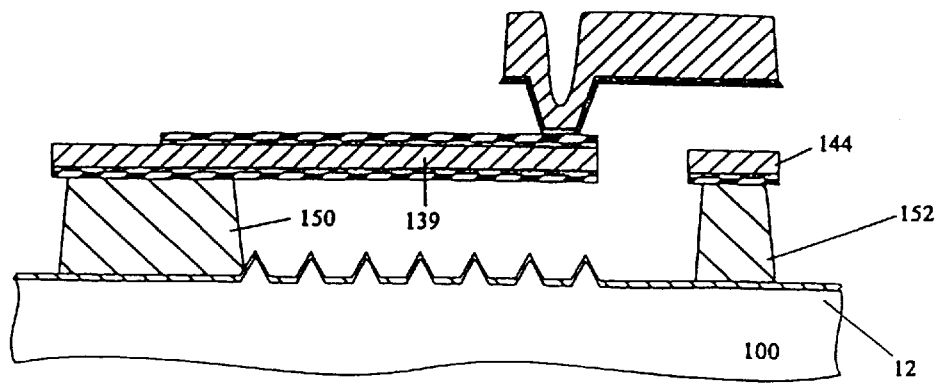
FIG. 19 shows an alternative embodiment of a micromechanical relay, whose fixed electrode has a surface corresponding to the surface of the fixed electrode of the micromechanical relay shown in FIGS. 17 and 18.

On the basis of FIGS. 17–19, a further embodiment is now explained by means of which the contact surface can be reduced according to the present invention. For providing in the case of this embodiment electrodes whose surfaces have the desired properties, pyramids are etched into a monocrystalline silicon wafer in a wet-chemical process. When these pyramids are being produced, the different crystal orientations of the silicon are utilized, said crystal orientations having different etching rates. By means of this method, pyramids of excellent pointedness can be produced. Hence, the contact surfaces and, consequently, the adhesion forces can be reduced drastically. The use of silion as a substrate material is, however, absolutely necessary. The electrode having the desired surface properties can now be applied to the points formed in the substrate, cf. electrode 380 in FIGS. 17 and 18, or it can alternatively be arranged in said substrate, cf. FIG. 19.

The distances and the dimensions of the elevations and depressions in the surface of the fixed electrode treated in accordance with the present invention are variable and can be adapted to the process technology in question. Also the height of the elevations is variable.

What is claimed is:

1. A method of producing a micromechanical relay comprising the steps of:
   a) providing a substrate including a conductive fixed electrode in or on said substrate;
   b) applying a sacrificial layer;
   c) applying a conductive layer and structuring said conductive layer so as to define a beam structure as a movable counterelectrode opposite said fixed electrode, and applying a contact area, the conductive layer extending between an anchoring region and the contact area and being insulated from said contact area; and
   d) removing the sacrificial layer by means of etching so as to produce the beam structure comprising a movable area and an area secured to the anchoring region on the substrate, wherein
      the beam structure is defined such that etch access openings in said beam structure are structured such that the size of the area covered by the etch access openings used for etching the sacrificial layer increases from the area of the beam structure secured to the substrate to the movable area of the beam structure so that the etching of the sacrificial layer is controlled in such a way that the portion of the sacrificial layer arranged below the movable area of the beam structure is etched faster than the portion of the sacrificial layer arranged in the area of the anchoring region.

2. A method according to claim 1, wherein, prior to step b), two contacts are formed in or on the substrate, the contact area formed in step c) extending at least between said contacts and over them, said contact area being spaced from said contacts by the sacrificial layer.

3. A method according to claim 1, wherein the sacrificial layer is structured after its application so as to define the anchoring region of the beam structure relative to the substrate.

4. A method according to claim 2, wherein a metal layer is deposited on the substrate over the full area and wherein photolithographic structuring is carried out so as to define the fixed electrode and the contacts.

5. A method according to claim 1, wherein, prior to step b), an anchoring contact surface is produced in the area of the anchoring region of the beam structure.

6. A method according to claim 1, wherein the sacrificial layer is etched in step d) in such a way that a part of said sacrificial layer remains so as to form an anchoring layer for the fixed part of the beam structure for anchoring to the substrate.

7. A method according to claim 6, wherein, in step c), two contacts arranged on the sacrificial layer are additionally formed by structuring the conductive structure, the sacrificial layer being etched in step d) in such a way that also two support areas of the sacrificial layer remain on the substrate, the contacts being arranged on said support areas.

8. A method according to claim 1, wherein the sacrificial layer is removed by means of dry etching.

9. A method according to claim 8, wherein the sacrificial layer consists of polyimide.

10. A method according to claim 1, wherein, in step c), a passivation layer is applied prior to and after the application of the conductive layer, said passivation layers being applied such that the conductive layer is arranged between two passivation layers.

11. A method according to claim 10, wherein the conductive layer consists of gold and the two passivation layers consist of $SiO_2$.

12. A method according to claim 10, wherein the conductive layer and the passivation layers are structured such that the compressive stress of the passivation layer, which is arranged below the conductive layer, exceeds the compressive stress of the passivation layer, which is arranged above the conductive layer, so as to cause the movable area of the beam structure to be deflected away from the substrate when the sacrificial layer has been removed.

13. A method according to claim 12, wherein the conductive layer and the passivation layers are structured such that, after the structuring, the volume of the passivation layer arranged below the conductive layer is larger than the volume of the passivation layer arranged above the conductive layer.

14. A method according to claim 10, wherein the passivation layer applied on top of the conductive layer is thinner than the passivation layer applied below the conductive layer.

15. A method according to claim 1, wherein the beam structure consists of a single beam having provided therein etch access openings by means of structuring, said etch access openings being used for etching the sacrificial layer.

16. A method according to claim 1, wherein the beam structure consists of a plurality of juxtaposed individual beams.

17. A method according to claim 16, wherein the extent to which the movable area of the beam structure is deflected is controlled by adjusting the width of the individual beams.

18. A method according to claim 16, wherein the individual beams of the beam structure are structured such that they taper towards the movable area of the beam structure in a wedge-shaped configuration.

19. A method according to claim 1, wherein the contact area is applied in the form of a contact bridge extending transversely to the beam structure, said contact bridge being insulated from the conductive layer of the beam structure and being attached to said beam structure in the movable area thereof.

20. A method according to claim 19, wherein said contact bridge is provided with a compensation layer, which is applied to the upper side of said contact bridge in the area extending between the contacts and in which an self-contained compressive stress exists by means of which an self-contained tensile stress of the contact bridge is compensated.

21. A method according to claim 1, wherein the contact area consists of gold.

22. A method according to claim 21, wherein the compensation layer consists of TiW.

23. A method according to claim 3, wherein the sacrificial layer is photolithographically structured such that the anchoring region comprises two anchoring subregions in such a way that the beam structure has at both ends thereof the areas secured to the substrate, whereas the movable area is located in the central region thereof.

24. A method according to claim 6, wherein the sacrificial layer is etched in such a way that the anchoring layer defines two anchoring subregions in such a way that the beam structure has at both ends thereof the areas secured to the substrate, whereas the movable area is located in the central region thereof.

25. A method according to claim 1, wherein the conductive fixed electrode is implemented in step a) with surface properties of such a nature that, during the future operation of the micromechanical relay, a contact surface of the fixed electrode with the movable counterelectrode will be reduced in comparison with the contact surface of an essentially flat surface of the fixed electrode.

26. A method according to claim 25, wherein the conductive fixed electrode is produced by electrodeposition and is then pre-etched so as to roughen the surface thereof.

27. A method according to claim 25, wherein the conductive electrode is produced by electrodepositing a layer, said layer being then structured so as to form elevations and depressions therein.

28. A method according to claim 25, wherein a monocrystalline silicon is used as a substrate, pyramidal structures being etched in a wet-chemical process into the surface area of said monocrystalline silicon in or on which the fixed electrode is formed.

* * * * *